United States Patent
Ringler et al.

(10) Patent No.: US 12,311,517 B2
(45) Date of Patent: May 27, 2025

(54) METHOD FOR CONTROLLING AND REGULATING A MACHINE TOOL AND HANDLE FOR MACHINE TOOL

(71) Applicant: Hilti Aktiengesellschaft, Schaan (LI)

(72) Inventors: Stefan Ringler, Schwabmuehlhausen (DE); Ehsan Mahdizadeh, Kaufering (DE); Steffen Geiger, Munich (DE)

(73) Assignee: Hilti Aktiengesellschaft, Schaan (LI)

( * ) Notice: Subject to any disclaimer, the term of this patent is extended or adjusted under 35 U.S.C. 154(b) by 0 days.

(21) Appl. No.: 17/768,552

(22) PCT Filed: Nov. 4, 2020

(86) PCT No.: PCT/EP2020/080886
§ 371 (c)(1),
(2) Date: Apr. 13, 2022

(87) PCT Pub. No.: WO2021/094152
PCT Pub. Date: May 20, 2021

(65) Prior Publication Data
US 2024/0116160 A1   Apr. 11, 2024

(30) Foreign Application Priority Data
Nov. 14, 2019  (EP) .................................... 19209141

(51) Int. Cl.
*B25D 11/06* (2006.01)
*B25D 17/04* (2006.01)

(52) U.S. Cl.
CPC ............ *B25D 11/064* (2013.01); *B25D 17/04* (2013.01); *B25D 2216/0015* (2013.01);
(Continued)

(58) Field of Classification Search
CPC ............ B25D 17/04; B25D 2216/0015; B25D 11/064; B25D 2250/201; B25D 2250/221; B25D 2250/245
(Continued)

(56) References Cited

U.S. PATENT DOCUMENTS

| 6,694,625 B1 | 2/2004 | Wright |
| 7,868,263 B2 | 1/2011 | Hammerstingl et al. |

(Continued)

FOREIGN PATENT DOCUMENTS

| CA | 1217070 A | 1/1987 |
| CN | 1257774 A | 6/2000 |

(Continued)

OTHER PUBLICATIONS

International Search Report of PCT/EP2020/080893, dated Feb. 10, 2021.
(Continued)

*Primary Examiner* — Robert F Long
*Assistant Examiner* — Xavier A Madison
(74) *Attorney, Agent, or Firm* — Davidson Kappel LLC (57) ABSTRACT

Method for the open-loop and closed-loop control of a power tool, in particular a chipping hammer, having a drive, a control device, a sensor device, a transmission device and a handle apparatus, wherein the handle apparatus contains a lever element with a signal transmitter, said lever element being pivotable relative to the sensor device. The method includes: sensing a first and second position of the signal transmitter by the sensor device; determining an acceleration of the signal transmitter from the first position to the second position by the control device; setting a first rotational speed for the drive by the control device for the output of a first impact energy value of the transmission device when the determined acceleration reaches a first predetermined (Continued)

threshold value or setting a second rotational speed for the drive by the control device for the output of a second impact energy value of the transmission device when the determined acceleration reaches a second predetermined threshold value. A handle apparatus on a power tool, in particular a chipping hammer, is also provided.

20 Claims, 10 Drawing Sheets

(52) U.S. Cl.
CPC .. *B25D 2250/201* (2013.01); *B25D 2250/221* (2013.01); *B25D 2250/245* (2013.01)

(58) Field of Classification Search
USPC .......................................................... 173/117
See application file for complete search history.

(56) References Cited

U.S. PATENT DOCUMENTS

| | | | |
|---|---|---|---|
| 8,561,715 | B2 | 10/2013 | Gut et al. |
| 10,675,747 | B2 | 6/2020 | Gut et al. |
| 2008/0053805 | A1 | 3/2008 | Wanek et al. |
| 2009/0120658 | A1 | 5/2009 | Kuhnle et al. |
| 2009/0120770 | A1* | 5/2009 | Hammerstingl ..... B25D 17/043 200/61.85 |
| 2011/0011609 | A1 | 1/2011 | Simm et al. |
| 2011/0114696 | A1 | 5/2011 | Zhou |
| 2011/0220060 | A1 | 9/2011 | Hausler et al. |
| 2012/0103643 | A1 | 5/2012 | Binder et al. |
| 2013/0140050 | A1* | 6/2013 | Eshleman ........... B25B 23/0064 173/1 |
| 2013/0284577 | A1 | 10/2013 | Korherr et al. |
| 2014/0216773 | A1 | 8/2014 | Steurer et al. |
| 2015/0006104 | A1 | 1/2015 | Okada et al. |
| 2015/0151415 | A1 | 1/2015 | Saitou et al. |
| 2016/0022393 | A1 | 1/2016 | Yoshida et al. |
| 2016/0121472 | A1 | 5/2016 | Comarmond et al. |
| 2017/0101747 | A1 | 4/2017 | Borgers et al. |
| 2017/0109488 | A1 | 4/2017 | Still et al. |
| 2017/0269006 | A1 | 9/2017 | Wang et al. |
| 2017/0353847 | A1 | 12/2017 | Coulis et al. |
| 2017/0361447 | A1 | 12/2017 | Ontl et al. |
| 2018/0099394 | A1 | 4/2018 | Ichikawa et al. |
| 2018/0339385 | A1 | 11/2018 | Yamamoto et al. |
| 2019/0030696 | A1 | 1/2019 | Seith et al. |
| 2024/0109172 | A1 | 4/2024 | Ringler et al. |

FOREIGN PATENT DOCUMENTS

| | | |
|---|---|---|
| CN | 1758169 A | 4/2006 |
| CN | 1773218 A | 5/2006 |
| CN | 1781678 A | 6/2006 |
| CN | 201093036 Y | 7/2008 |
| CN | 101479079 A | 7/2009 |
| CN | 101577520 A | 11/2009 |
| CN | 101637906 A | 2/2010 |
| CN | 101743100 A | 6/2010 |
| CN | 102126201 A | 7/2011 |
| CN | 102528770 A | 7/2012 |
| CN | 103209852 A | 7/2013 |
| CN | 104080624 A | 1/2015 |
| CN | 104271318 A | 1/2015 |
| CN | 105073063 A | 11/2015 |
| CN | 105324217 A | 2/2016 |
| CN | 105976450 A | 9/2016 |
| CN | 205818937 U | 12/2016 |
| CN | 106502756 A | 3/2017 |
| CN | 107000183 A | 8/2017 |
| CN | 108453675 A | 8/2018 |
| CN | 207888584 U | 9/2018 |
| CN | 108927772 A | 12/2018 |
| CN | 109318181 A | 2/2019 |
| CN | 114521163 A | 5/2022 |
| DE | 102006032092 A1 | 8/2007 |
| DE | 102011080374 A1 | 2/2013 |
| DE | 102012209806 A1 | 12/2013 |
| DE | 102013201708 A1 | 8/2014 |
| DE | 102017131144 A1 | 6/2019 |
| EP | 0328799 A2 | 8/1989 |
| EP | 1895555 A2 | 3/2008 |
| EP | 2058089 A1 | 5/2009 |
| EP | 2338646 A2 | 6/2011 |
| EP | 3023203 A1 | 5/2016 |
| EP | 3184259 A1 | 6/2017 |
| WO | WO 2018063978 A1 | 4/2018 |
| WO | WO 2021/094146 A1 | 5/2021 |
| WO | WO 2021/094152 A1 | 5/2021 |
| WO | WO 2021/094153 A1 | 5/2021 |
| WO | WO2021/094155 A1 | 5/2021 |
| WO | WO 2021/094157 A1 | 5/2021 |

OTHER PUBLICATIONS

International Search Report of PCT/EP2020/080859, dated Feb. 3, 2021.
International Search Report of PCT/EP2020/080886, Feb. 5, 2021.
International Search Report of PCT/EP2020/080907, Feb. 5, 2021.
International Search Report of PCT/EP2020/080899, Feb. 5, 2021.

* cited by examiner

METHOD FOR CONTROLLING AND REGULATING A MACHINE TOOL AND HANDLE FOR MACHINE TOOL

The present invention relates to a method for the open-loop and closed-loop control of a power tool, in particular a chipping hammer, having a drive, a control device, a sensor device, a transmission device and a handle apparatus, wherein the handle apparatus contains a lever element with a signal transmitter, said lever element being pivotable relative to the sensor device.

Furthermore, the present invention relates to a handle apparatus on a power tool, in particular a chipping hammer, having a drive, a control device, a transmission device, wherein the handle apparatus contains a lever element that is pivotable relative to a housing of the power tool.

BACKGROUND

A chipping hammer according to the prior art is used to work on (i.e. tear up, break up or chisel) mineral materials, for example concrete, brick or the like. The chipping hammer can also be referred to as a demolition hammer, mechanical pick or breaker. The chipping hammer has a drive, which, with the aid of a transmission mechanism, transmits strikes to a chisel tool (also known as a chisel). The drive may be an electric motor or combustion engine.

Generally, the chipping hammer has two handles, which are positioned on opposite sides of the housing of the chipping hammer. At least one of the two handles comprises an activation switch, with which the chipping hammer can be activated or switched on. The handles in this case extend usually at an obtuse angle to a longitudinal axis of the housing of the chipping hammer. In order to use the chipping hammer, the activation switch is pressed and the chipping hammer is activated such that strikes are transmitted to the chisel by the drive.

SUMMARY OF THE INVENTION

A problem in a chipping hammer according to the prior art is that, following activation (i.e. switching on) of the chipping hammer, the drive is generally operated with a relatively high or even maximum rotational speed and consequently the chipping hammer is operated at full power. If, at this time, a user does not yet have sufficient control of the chipping hammer, i.e. the user has not yet positioned their two hands on the respective handles and is not yet firmly holding the chipping hammer, the chipping hammer is guided poorly and adequate and safe working is not possible. Furthermore, there is the general problem that the activation (i.e. switching on) of the chipping hammer and the output of strikes can surprise a user, since, although the user is already firmly holding the chipping hammer with their hands, they do not yet expect the activation (i.e. switching on) of the chipping hammer and the output of strikes.

It is an object of the present invention to solve the abovementioned problem and to provide a method for the open-loop and closed-loop control of a power tool, in particular a chipping hammer, and a handle apparatus on a power tool, in particular on a chipping hammer, which makes it possible to work easily and safely with a power tool, in particular with a chipping hammer.

The present disclosure provides a method for the open-loop and closed-loop control of a power tool, in particular a chipping hammer, having a drive, a control device, a sensor device, a transmission device and a handle apparatus, wherein the handle apparatus contains a lever element with a signal transmitter, said lever element being pivotable relative to the sensor device.

According to the invention, the following method steps are provided:
- sensing a first and second position of the signal transmitter by the sensor device;
- determining an acceleration of the signal transmitter from the first position to the second position by the control device;
- setting a first rotational speed for the drive by the control device for the output of a first impact energy value of the transmission device when the determined acceleration reaches a first predetermined threshold value or setting a second rotational speed for the drive by the control device for the output of a second impact energy value of the transmission device when the determined acceleration reaches a second predetermined threshold value.

According to an advantageous embodiment of the present invention, it may be possible for the second position of the signal transmitter to be arranged in a direction below the first position of the signal transmitter such that the acceleration of the signal transmitter in the direction is able to be determined.

According to an advantageous embodiment of the present invention, it may be possible for the second rotational speed to be higher than the first rotational speed and for the second impact energy value to be higher than the first impact energy value.

The present invention provides a handle apparatus on a power tool, in particular a chipping hammer, having a drive, a control device, a transmission device, wherein the handle apparatus contains a lever element that is pivotable relative to a housing of the power tool.

According to the invention, the lever element is movable reversibly relative to the housing of the power tool by exertion of a force in one direction, and a sensor device is contained for sensing at least one first or second position of the lever element relative to the housing of the power tool, wherein the control device is configured to determine an acceleration of the signal transmitter from the first position to the second position and to set a first rotational speed for the drive for the output of a first impact energy value of the transmission device when the determined acceleration reaches a first predetermined threshold value or to set a second rotational speed for the drive for the output of a second impact energy value of the transmission device when the determined acceleration reaches a second predetermined threshold value.

According to an advantageous embodiment of the present invention, it may be possible for the lever element to contain a signal transmitter with at least one magnet and for the sensor device to contain at least one first and second Hall sensor for sensing the at least one magnet, wherein the signal transmitter is movable reversibly relative to the sensor device.

The second rotational speed value is in this case higher than the first rotational speed value. The drive may in this case be in the form of an electric motor. When the power tool is in the form of a chipping hammer, the transmission device can be configured as an impact mechanism device. With the aid of a high rotational speed value, as a result of a combination of the drive in the form of an electric motor with the transmission device in the form of an impact mechanism device, high impact energy on a tool in the form of a chisel can be generated.

According to an advantageous embodiment of the present invention, it may be possible for a switch-on device, to be actuated separately, to be contained on the power tool. By way of the switch-on device, at least the drive of the power tool can be activated. In this case, the transmission device is not activated with the aid of the switch-on device.

Further advantages will become apparent from the following description of the figures. Various exemplary embodiments of the present invention are shown in the figures. The figures, the description and the claims contain numerous features in combination. A person skilled in the art will expediently also consider the features individually and combine them to form useful further combinations.

BRIEF DESCRIPTION OF THE DRAWINGS

In the figures, identical and similar components are denoted by the same reference signs. In the figures.

DETAILED DESCRIPTION

Figure 1:
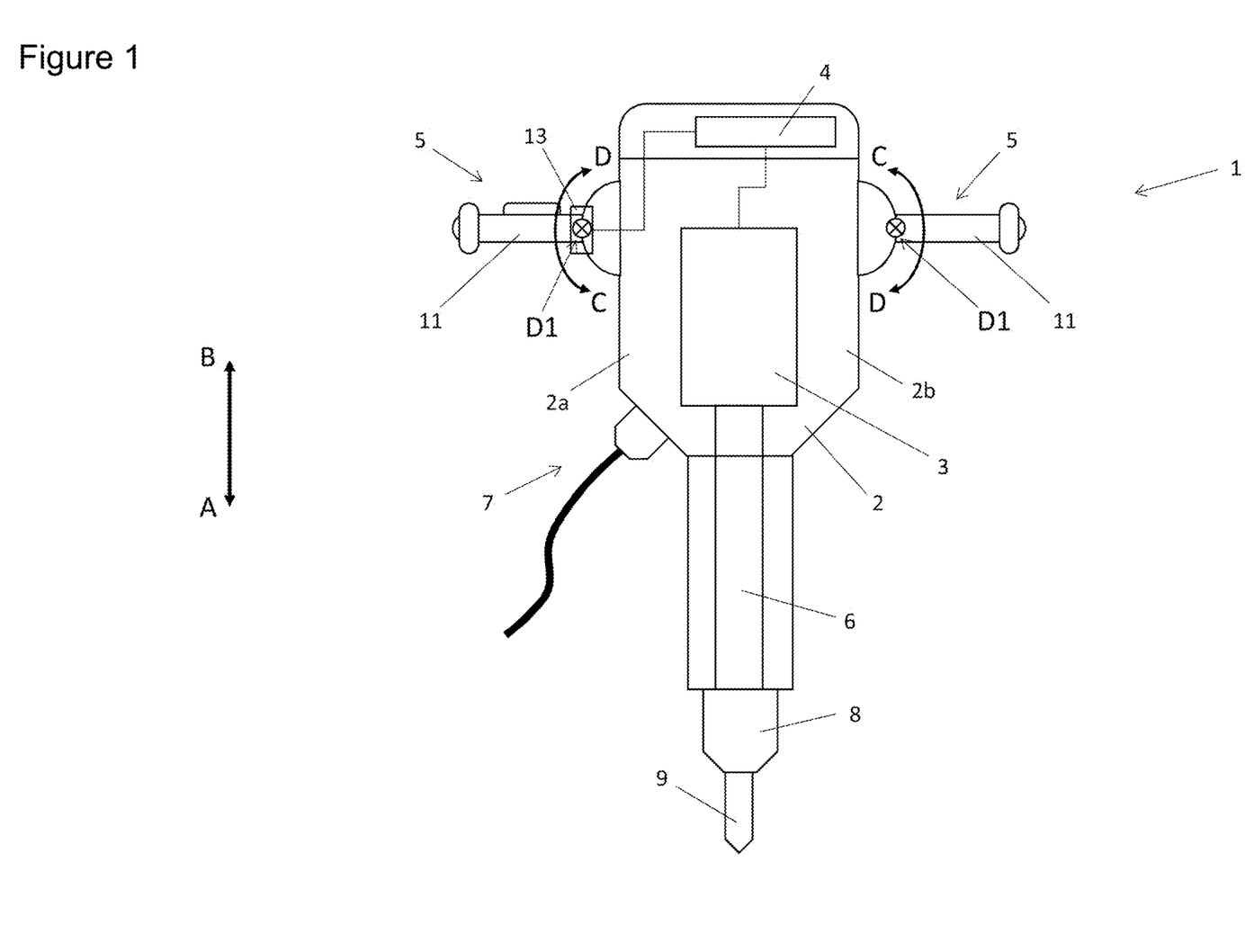
FIG. 1 shows a schematic front view of a power tool according to the invention in the form of a chipping hammer having a handle apparatus according to the invention.

FIG. 1 shows a power tool 1 according to the invention in the form of a chipping hammer. The power tool 1 can also be in the form of a hammer drill, a power drill, a saw, a sander or the like, however.

As indicated in FIG. 1, the power tool 1 in the form of a chipping hammer contains primarily a housing 2, a drive 3, a control device 4, a first and second handle apparatus 5, a transmission device 6, an energy supply device 7 and a tool fitting 8.

Positioned inside the housing are primarily the drive 3, the control device 4 and the transmission device 6. The drive 3 is in this case in the form of an electric motor. The electric motor may be a brushless electric motor.

Positioned at a lower end of the housing 2 of the power tool 1 is the tool fitting 8. With the aid of the tool fitting 8, a tool 9 can be fitted and held. In the figures, the tool 9 is in the form of a chisel.

Furthermore, the energy supply device 7 is provided on the first side wall 2a of the housing 2 of the power tool 1. In the given example of the power tool 1, the energy supply device 7 is a power grid connection and a power grid cable. A free end of the power grid cable can be connected to a power grid connection (also known as a power outlet). With the aid of the energy supply device 7, the power tool 1 and in particular the drive 3 in the form of an electric motor can be supplied with energy, for example with electrical energy.

According to an alternative embodiment of the power tool 1 according to the invention, the energy supply device 7 can also be in the form of a single rechargeable battery or of a plurality of rechargeable batteries. With the aid of one or more battery interfaces, the single rechargeable battery or plurality of rechargeable batteries is/are positioned on or in the housing 2 of the power tool 1.

As already mentioned above, the drive 3 is in the form of an electric motor in the present embodiment of the power tool 1. Alternatively, the drive 3 can also be a combustion engine. In this case, the energy supply device 7 is in the form of a fuel tank.

According to a further alternative embodiment of the power tool 1 according to the invention, the drive 3 can also be configured in the form of a pneumatic drive or compressor. In this case, the energy supply device 7 can be a compressed air connector or compressed air supply on or in the power tool 1.

The drive 3 in the form of an electric motor serves to generate a torque. With the aid of the transmission device 6, the torque generated by the drive 3 can be transmitted in the form of (hammer) strikes to the tool fitting 8 and ultimately to the tool 9 in the form of a chisel. The transmission device 6 can also be referred to as an impact mechanism. The higher the frequency of the strikes, the more impact energy is generated.

The control device 4 is connected to the first and second handle apparatuses 5 and to the drive 3. Signals and communication data can thus be sent and received between the handle apparatuses 5, the drive 3 and the control device 4. The control device 4 serves for the open-loop and closed-loop control of the various functions of the power tool 1 and in particular for setting the parameters or operating parameters of the drive 3. With the aid of the control device 4, it is thus possible to set specifically the rotational speed of the drive 3 in the form of an electric motor as parameter or operating parameter.

Figure 2A:
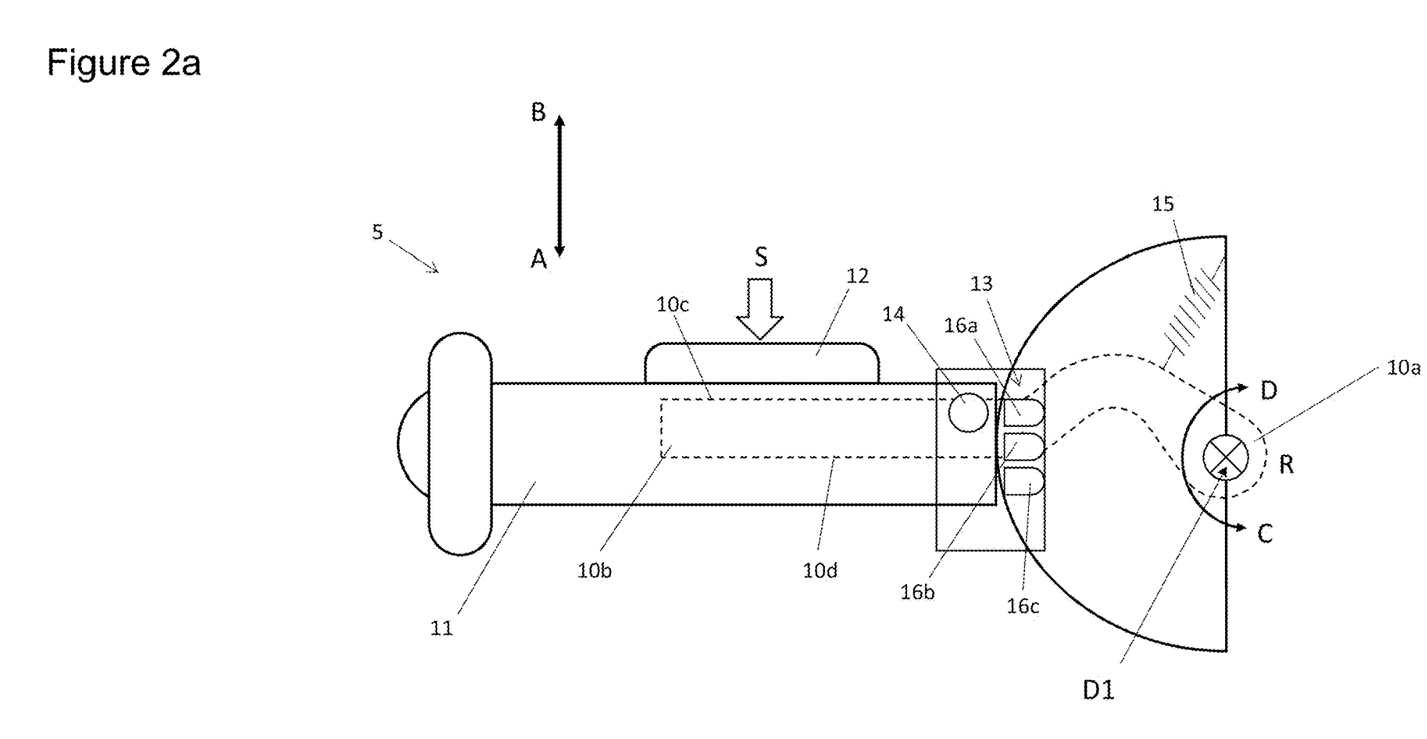
FIG. 2a shows a detail view of the handle apparatus in a first position according to a first exemplary embodiment.
Figure 2B:
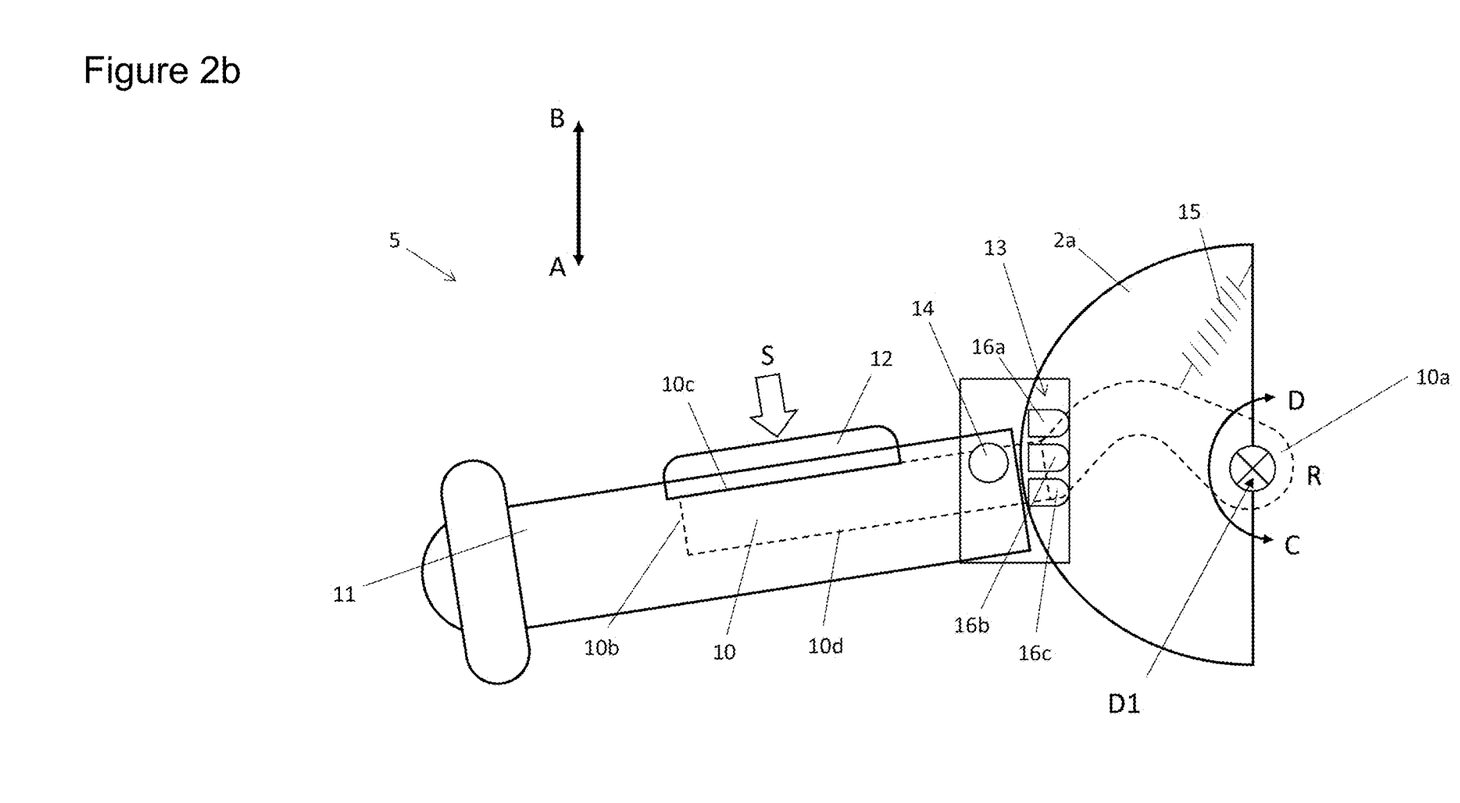
FIG. 2b shows a detail view of the handle apparatus in a second position according to the first exemplary embodiment.
Figure 2C:
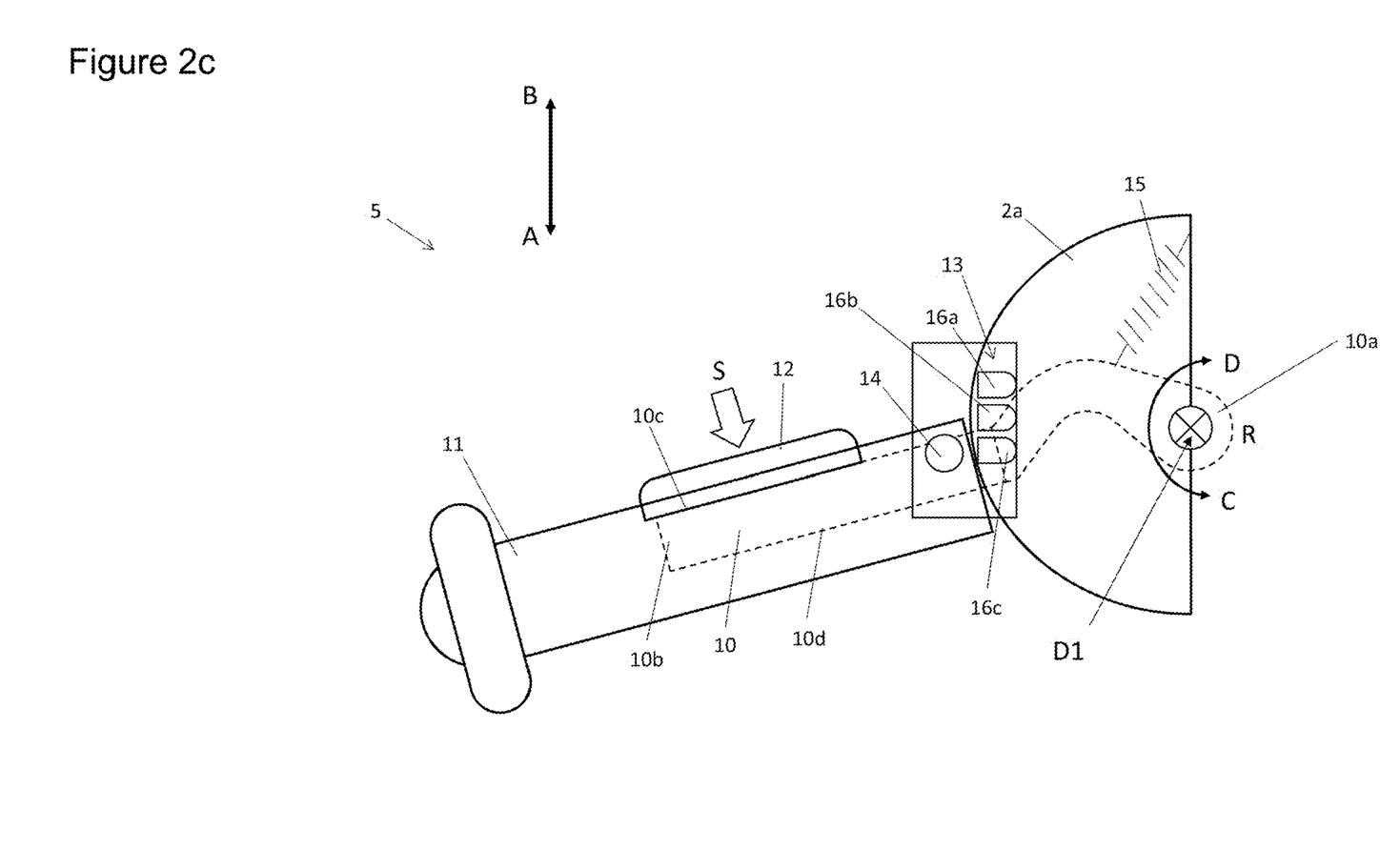
FIG. 2c shows a detail view of the handle apparatus in a third position according to the first exemplary embodiment.

The first handle apparatus 5 is positioned in a movable manner on a first side wall 2a of the housing 2 and the second handle apparatus 5 is positioned in a movable manner on a second side wall 2b of the housing 2. As shown in FIGS. 1 and 2, both the first and the second handle apparatus 5 each contain a lever element 10 and a handle piece 11. Each lever element 10 of the first and second handle apparatus 5 is accordingly mounted in a pivotable manner in a direction of rotation C or D via a corresponding first pivot point D1. The first and second handle apparatuses 5 serve for the holding and guiding of the power tool 1 by a user. The user is not shown in the figures.

FIGS. 2a to 2c illustrate the handle apparatus 5 according to the invention in the form of a first exemplary embodiment. The handle apparatus 5 according to the first exemplary embodiment in this case contains primarily a lever element 10, a handle piece 11, an activation element 12, a sensor device 13 and a signal transmitter 14.

The activation element 12 in the form of an actuating switch serves for activating the drive 3 of the power tool 1. The activation element 12 can be moved reversibly from a first position to a second position by exertion of a force in a direction S. In FIG. 2a, the activation element 12 is shown in the first position, i.e. in a non-pressed state. The first position corresponds in this case to the uppermost position.

The drive 3 is activated as soon as the activation element 12 is moved away from the first position into the second position. In FIGS. 2b and 2c, the activation element 12 is illustrated in each case in the second position, i.e. in a pressed state. The activation element 12 is connected to the control device 4 such that signals can be exchanged between the activation element 12 and the control device 4. The connection between the activation element 12 and the control device 4 is not illustrated in the figures. The particular position, i.e. the first or second position, of the activation element 12 is transmitted to the control device 4 with the aid of a corresponding signal. When the activation element 12 is in the second position, only the drive 3 of the power tool 1 is activated. The transmission device 6 in the form of an impact mechanism device is not activated or started just by the activation element 12 being pressed in the arrow direction S.

The sensor device 13 is connected to the control device 4 such that signals, data and information can be exchanged between the sensor device 13 and the control device 4.

The lever element 10 is substantially in the form of an elongate lever arm having a first end 10a and a second end 10b and having a top side 10c and underside 10d. The lever element 10 is mounted at the first end 10a so as to be reversibly pivotable in a direction of rotation C or D with respect to the housing 2 of the power tool 1 via a first pivot point D1. When a force is exerted in the direction A on the top side 10c of the lever element 10, the lever element 10 pivots about the pivot point D1 in the direction of rotation C. When a force is no longer exerted on the top side 10c of the lever element 10, the lever element 10 pivots back into the starting position about the first pivot point D1 in the direction of rotation D with the aid of a first spring element 15. The first spring element 15 can in this case be configured in the form of a spiral spring or torsion bar spring.

The signal transmitter 14 is firmly connected to the lever element 10 and is configured in the form of a magnet. The magnet may be a permanent magnet. As shown in FIGS. 2a to 2c, the signal transmitter 14 in the form of a magnet is positioned on the lever element 10. As a result of being positioned on the lever element 10, the signal transmitter 14 can be moved relative to the housing 2 of the power tool 1.

The sensor device 13 is positioned on the first side wall 2a of the housing 2 of the power tool 1 and contains primarily a first, second and third Hall sensor 16a, 16b, 16c. As shown in FIGS. 2a to 2c, the three Hall sensors 16a, 16b, 16c are positioned on the housing 2 of the power tool 1 one below another in the direction A. The Hall sensors 16a, 16b, 16c are positioned on the housing 2 of the power tool 1 such that at all times at least one of the three Hall sensors 16a, 16b, 16c can detect the position of the signal transmitter 14 in the form of a magnet when the lever element 10 is pivoted in the direction of rotation C or D.

According to an alternative embodiment, it is also possible for more or fewer than three Hall sensors to be provided.

As already mentioned above, in FIG. 2a, the activation element 12 has not been pressed in the direction A and the handle apparatus 5 has not been pivoted in the direction C by exertion of a force. The first (i.e. uppermost) Hall sensor 16a of the sensor device 13 senses the proximity of the signal transmitter 14 in the form of a magnet. The sensor device 13 sends a corresponding signal to the control device 4 in order to inform the control device 4 that no force is being exerted on the handle apparatus 5. In this state, neither the drive 3 nor the transmission device 6 is activated.

Consequently, no impact energy is transmitted to the tool 9. For example, a tool change could be carried out safely in this state.

In FIG. 2b, a first force is exerted on the activation element 12 and the handle apparatus 5 in the direction A. As a result, the activation element 12 is moved from the first position into the second position. The drive 3 is then activated. At the same time, as a result of the exertion of the force in the direction A, the handle apparatus 5 and thus the lever element 10 are pivoted about the first pivot point D1 in the direction of rotation C. In FIG. 2b, enough force is exerted on the handle apparatus 5 and the lever element 10 for the handle apparatus 5 to be in a middle position. The signal transmitter 14 in the form of a magnet is in this case positioned such that the second (middle) Hall sensor 16b of the sensor device 13 can sense the magnet. The sensor device 13 thus senses that the handle apparatus 5 is in a middle position. When the sensor device 13 senses the middle position of the handle apparatus 5 with the aid of the second Hall sensor 16b, a corresponding signal is sent to the control device 4. The signal informs the control device 4 that a medium force is being exerted on the handle apparatus 5 by the user. The control device 4 controls the drive 3 in the form of an electric motor such that, depending on the medium force exertion on the handle apparatus 5, a first rotational speed is set for the drive 3. The first rotational speed specifies a first value of impact energy from the transmission device 6 to the tool 9.

In FIG. 2c, a second force is exerted on the handle apparatus 5 in the direction A. The second force is in this case greater than the first force. As can be seen in FIG. 2c, the activation element 12 continues to be in the second (i.e. pressed) position. The drive 3 continues to be activated by the activation element 12 being pressed in the direction S. As a result of the second (i.e. increased) force being exerted on the handle apparatus 5 in the direction A, the lever element 10 is pivoted further in the direction of rotation C than in FIG. 2b. The lever element 10 is in this case pivoted to such an extent that the signal transmitter 14 positioned on the lever element 10 is at the level of the third (i.e. bottommost) Hall sensor 16c. The sensor device 13 thus senses that maximum pressure is being exerted on the handle apparatus 5 and the handle apparatus 5 is in a lower (i.e. bottommost) position. When the sensor device 13 senses the bottommost position of the handle apparatus 5 with the aid of the third Hall sensor 16c, a corresponding signal is sent to the control device 4. The signal informs the control device 4 that a maximum force is being exerted on the handle apparatus 5 by the user. The control device 4 controls the drive 3 in the form of an electric motor such that, depending on the maximum force exertion on the handle apparatus 5, a second rotational speed is set for the drive 3. The second rotational speed value is in this case higher than the first rotational speed value. The second rotational speed specifies a second value of impact energy from the transmission device 6 to the tool 9. The second value of impact energy is greater than the first value of impact energy.

Figure 3A:
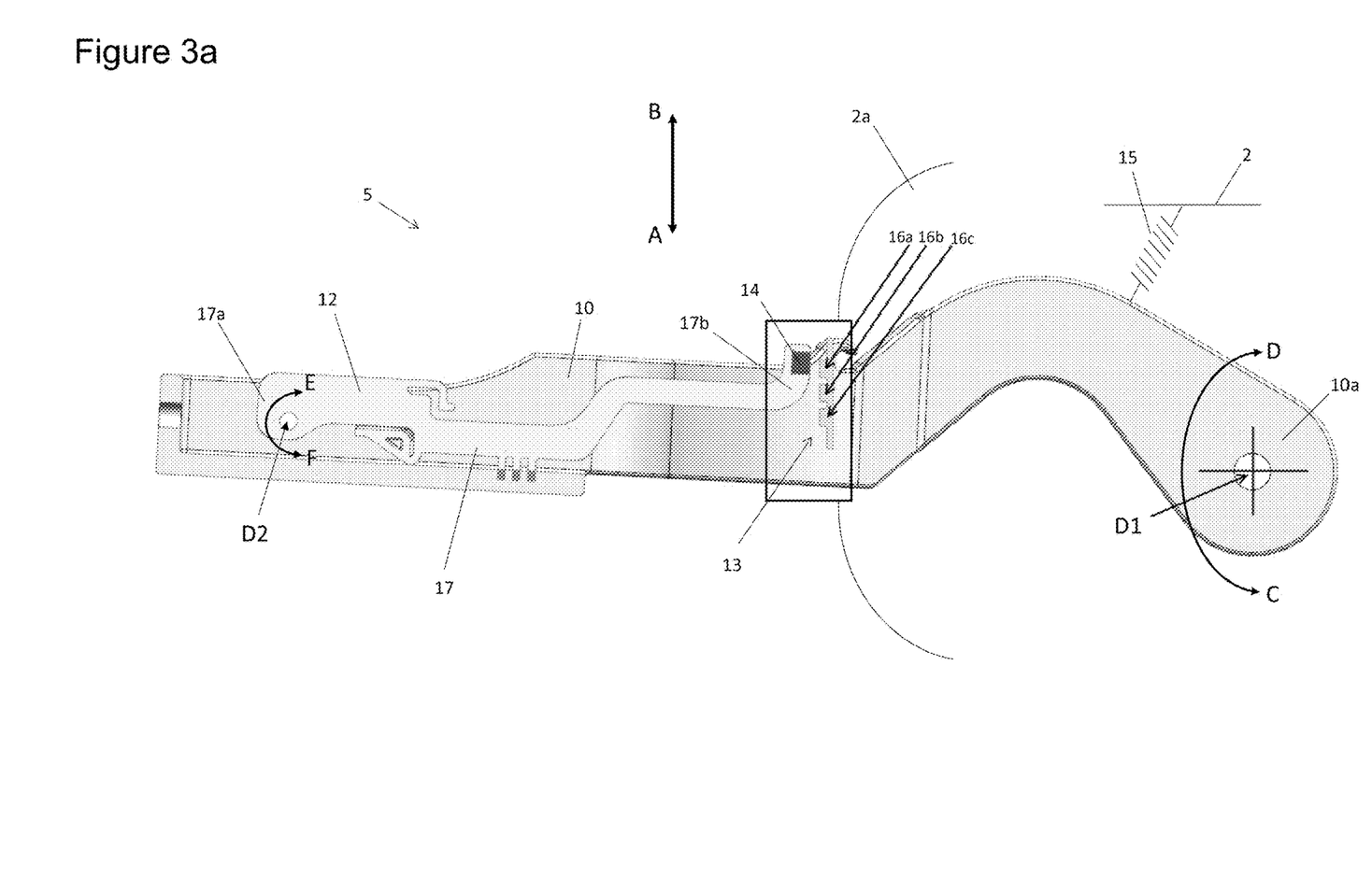
FIG. 3a shows a detail view of the handle apparatus in a first position according to a second exemplary embodiment.
Figure 3B:
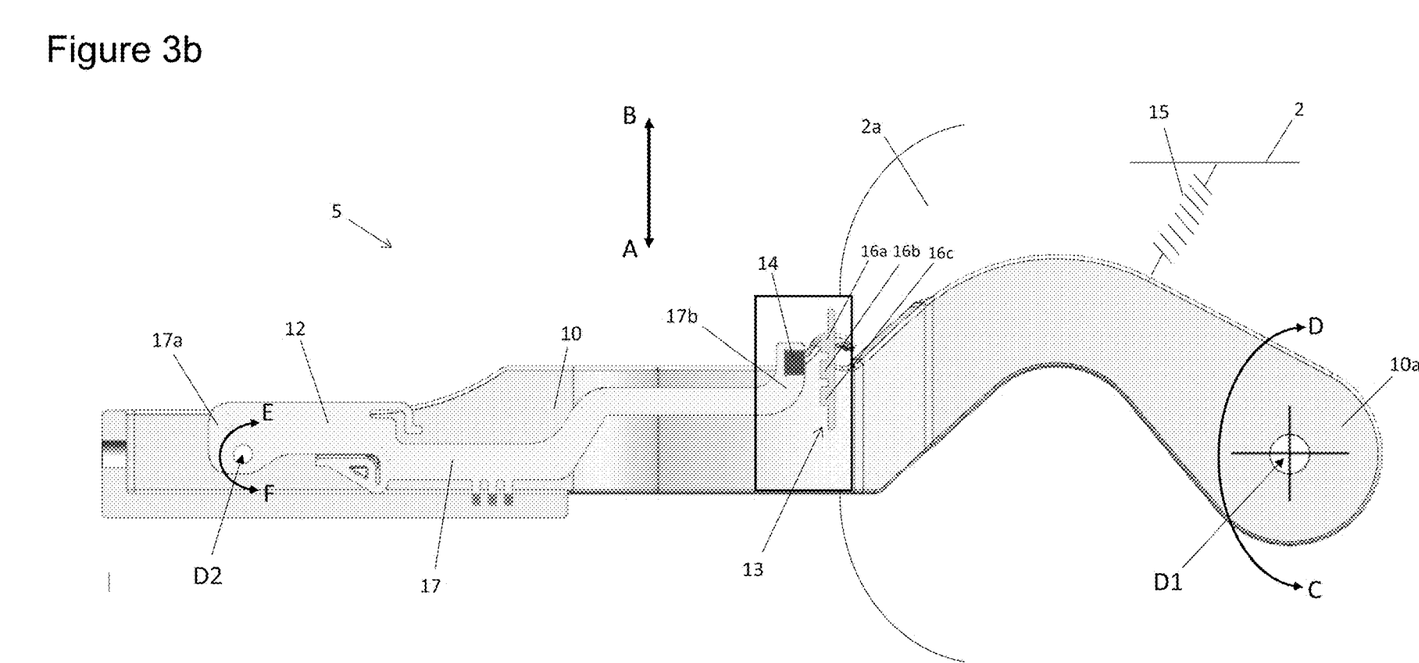
FIG. 3b shows a detail view of the handle apparatus in a second position according to the second exemplary embodiment.
Figure 3C:
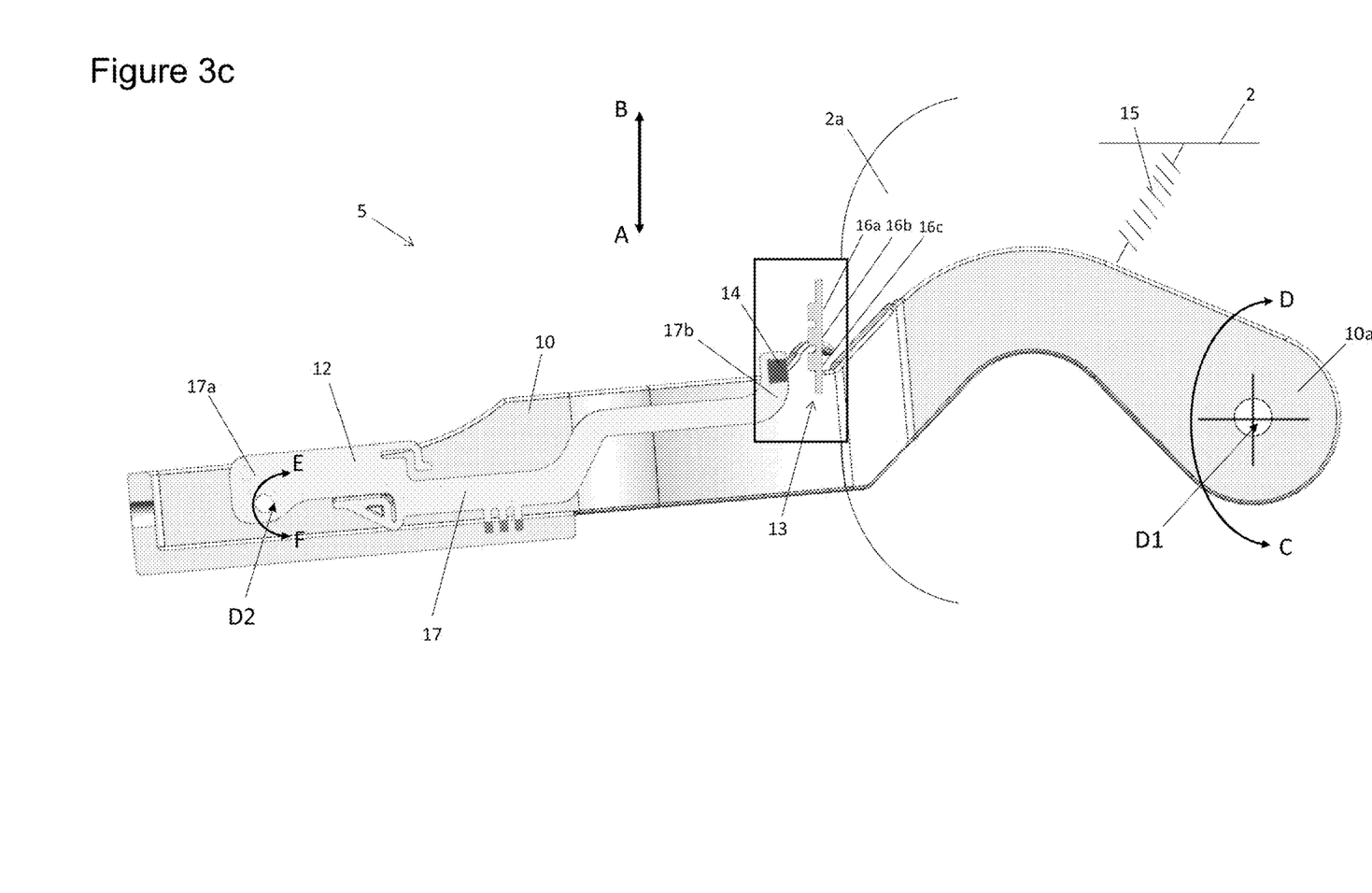
FIG. 3c shows a detail view of the handle apparatus in a third position according to the second exemplary embodiment.

FIGS. 3a to 3c illustrate the handle apparatus 5 according to the invention in the form of a second exemplary embodiment. The handle apparatus 5 according to the second exemplary embodiment in this case contains primarily a lever element 10, a handle piece 11, an activation element 12, a sensor device 13 and a signal transmitter 14.

As is apparent from FIGS. 3a to 3c, in contrast to the handle apparatus 5 according to the first exemplary embodiment, in the second exemplary embodiment the activation element 12 and the signal transmitter 14 are positioned on a connecting element 17. The connecting element 17 is configured substantially in an elongate form and has a first and second end 17a, 17b. The activation element 12 is positioned at the first end 17a and the signal transmitter 14 is positioned at the second end 17b of the connecting element 17.

In addition, a pivot bearing is provided at the first end 17a of the connecting element 17, such that the connecting element 17 can be pivoted about a second pivot point D2 in the direction of rotation E or F. As a result of a force being exerted on the activation element 12 in the direction A, the connecting element 17 is pivoted or rotated about the pivot point D2 in the direction of rotation E.

When the connecting element 17 is pivoted about the pivot point D2 in the direction of rotation E, the signal transmitter 14 positioned at the second end moves in the direction A. The signal transmitter 14 in the form of a magnet is thus guided past the three Hall sensors 16a, 16b, 16c of the sensor device 13.

As already mentioned above, the sensor device 13 senses the position of the signal transmitter 14 in the form of a magnet. By way of the position of the signal transmitter 14 relative to the sensor device 13, it is possible to determine the angle of the handle apparatus 5 and the force with which the handle apparatus 5 is being pressed in the direction A. As likewise already mentioned above, the rotational speed of the drive 3 and thus the output of impact energy from the transmission device 6 to the tool 9 are set depending on the position of the signal transmitter 14 and the position of the lever element 10 with respect to the sensor device 13 and with respect to the housing 2 of the power tool 1, respectively.

When a force or pressure is no longer exerted on the activation element 12 in the direction A, the activation element 12 moves back into the starting position in the direction B with the aid of a second spring element. The connecting element 17 is pivoted back about the pivot point D2 in the direction of rotation F with the aid of the second spring element. The second spring element is not shown in the figures.

Figure 4A:
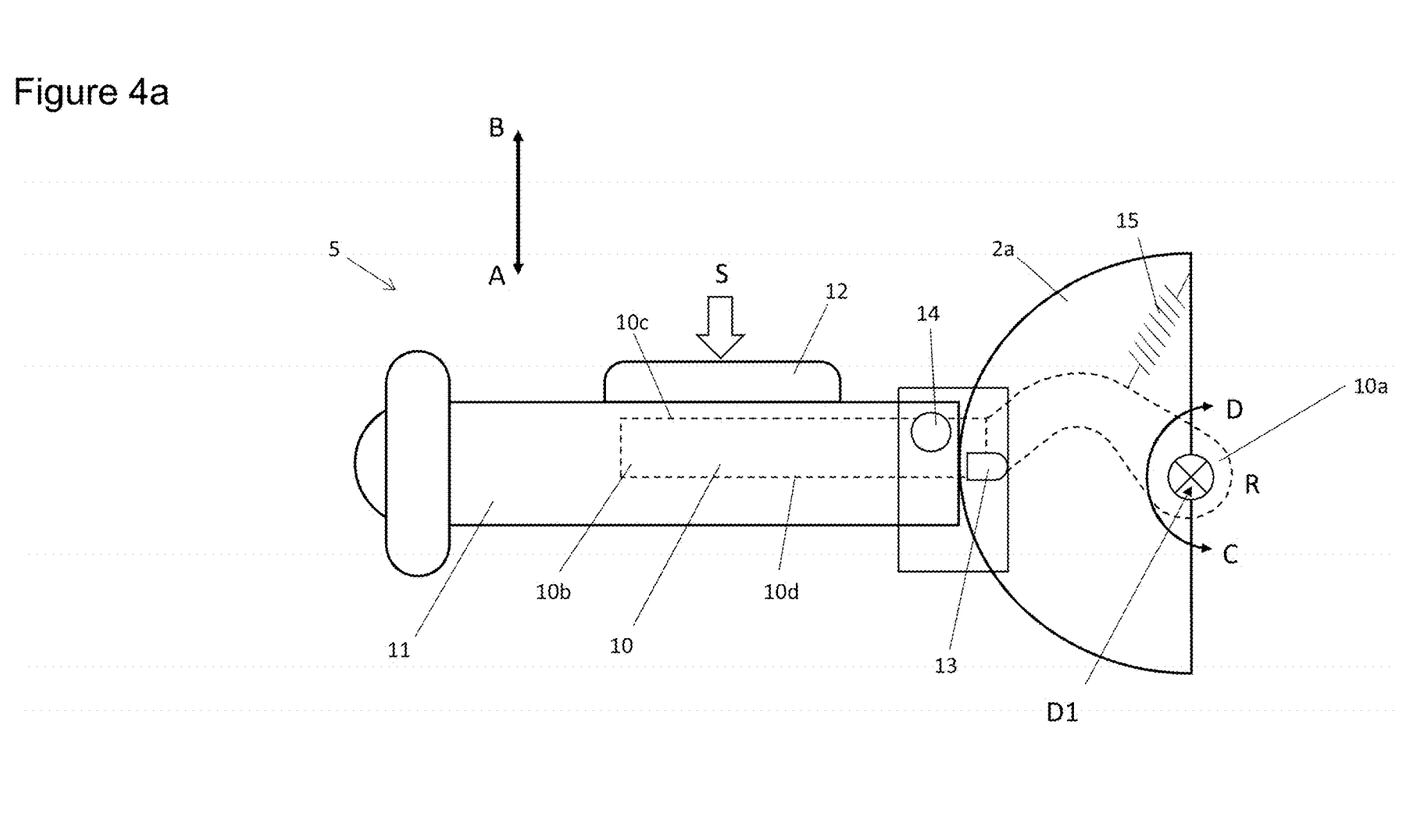
FIG. 4a shows a detail view of the handle apparatus in a first position according to a third exemplary embodiment.
Figure 4B:
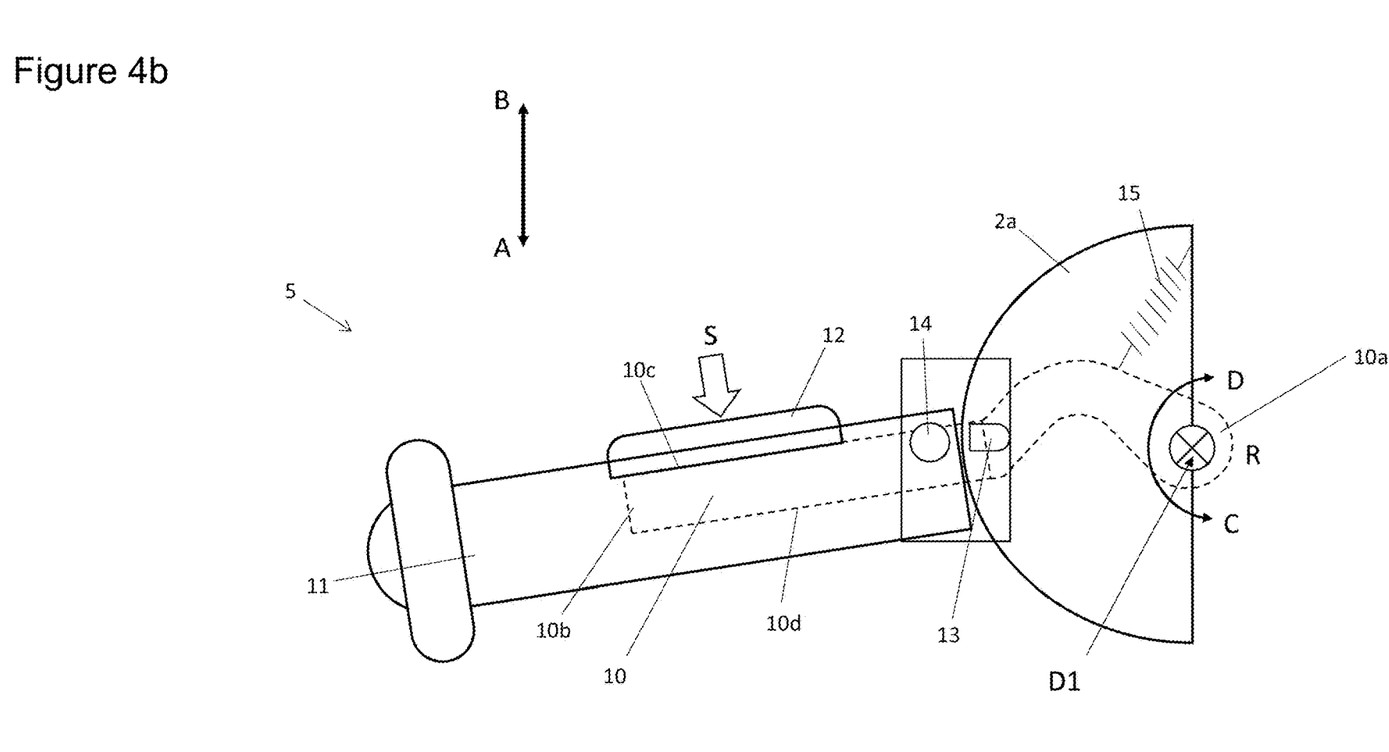
FIG. 4b shows a detail view of the handle apparatus in a second position according to the third exemplary embodiment.
Figure 4C:
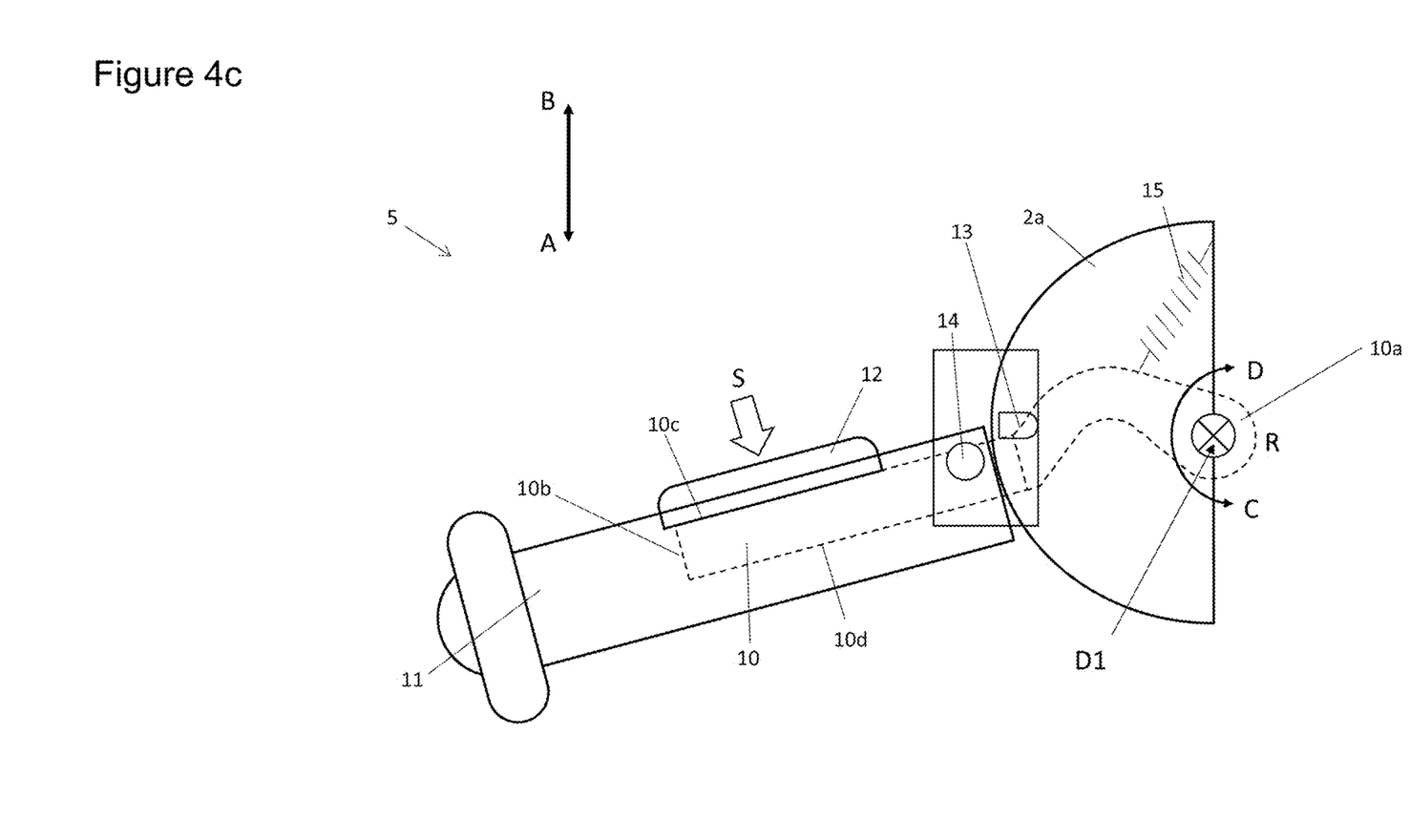
FIG. 4c shows a detail view of the handle apparatus in a third position according to the third exemplary embodiment.

FIGS. 4a to 4c illustrate the handle apparatus 5 according to the invention in the form of a third exemplary embodiment. The handle apparatus 5 according to the third exemplary embodiment in this case contains primarily a lever element 10, a handle piece 11, an activation element 12, a sensor device 13 and a signal transmitter 14.

The configuration of the handle apparatus 5 according to the third exemplary embodiment is similar to the handle apparatus 5 according to the first exemplary embodiment. The handle apparatus 5 according to the third exemplary embodiment differs from the handle apparatus 5 according to the first exemplary embodiment in that the sensor device 13, rather than containing a first, second and third Hall sensor 16a, 16b, 16c, contains only a 3D sensor. Alternatively, the sensor device can also contain more than one 3D sensor.

The 3D sensor can also be referred to as a TOF camera (=Time Of Flight camera) and/or PMD sensors (=photonic mixer devices).

The control device 4 sets a first rotational speed for the drive 3 of the power tool 1 when the lever element 10 with the signal transmitter 14 exhibits a certain acceleration that corresponds at least to a first predetermined threshold value. In order to determine the acceleration of the lever element 10 with the signal transmitter 14, first of all a first and second position of the signal transmitter 14 are sensed by the sensor device 13. When the signal transmitter 14 is moved downward past the sensor device 13 in the direction A, a first and second position of the signal transmitter 14 can be sensed by the sensor device 13. The sensed positions of the signal transmitter 14 are sent to the control device 4. The control device 4 determines an acceleration value from the indications of the positions of the signal transmitter 14 relative to the sensor device 13 and from the period of time between the first and second position of the signal transmitter 14. If this acceleration value corresponds to a first predetermined threshold value, a first rotational speed is set for the drive 3. If, however, this acceleration value corresponds to a second predetermined threshold value, a second rotational speed is set for the drive 3. The first rotational speed is in this case lower than the second rotational speed.

As a result of a first rotational speed being set for the drive 3, the transmission device 6 outputs first impact energy. As a result of a second rotational speed (i.e. one that is higher than the first rotational speed) being set for the drive 3, the transmission device 6 outputs second impact energy. The second impact energy is in this case higher than the first impact energy.

LIST OF REFERENCE SIGNS

1 Power tool
2 Housing
2a First side of the housing
2b Second side of the housing
3 Drive
4 Control device
5 Handle apparatus
6 Transmission device
7 Energy supply device
8 Tool fitting
9 Tool
10 Lever element
10a First end of the lever element
10b Second end of the lever element
10c Top side of the lever element
10d Underside of the lever element
11 Handle piece
12 Activation element
13 Sensor device
14 Signal transmitter
15 First spring element
16a First Hall sensor
16b Second Hall sensor
16c Third Hall sensor
17 Connecting element
17a First end of the connecting element
17b Second end of the connecting element

What is claimed is:

1. A method for an open-loop and closed-loop control of a power tool, the power tool having a drive, a controller, a sensor, a transmission and a handle, wherein the handle contains a lever with a signal transmitter, the lever being pivotable relative to the sensor, the method comprising steps of:

sensing a first and second position of the signal transmitter by the sensor;

determining an acceleration of the signal transmitter from the first position to the second position by the controller; and setting a first rotational speed for the drive by the controller for output of a first impact energy value of the transmission when the determined acceleration reaches a first predetermined threshold value or setting a second rotational speed for the drive by the controller for output of a second impact energy value of the transmission when the determined acceleration reaches a second predetermined threshold value;
wherein the lever is in the form of an elongate lever arm having a first end and a second end and having a top side and underside.

2. The method as recited in claim 1 wherein the second position of the signal transmitter is arranged in a direction below the first position of the signal transmitter such that the acceleration of the signal transmitter in the direction is able to be determined.

3. The method as recited in claim 1 wherein the second rotational speed is higher than the first rotational speed and the second impact energy value is higher than the first impact energy value.

4. The method as recited in claim 1 wherein the power tool is a chipping hammer.

5. The method as recited in claim 1 wherein the lever is mounted at the first end so as to be reversibly pivotable in a direction of rotation with respect to a housing of the power tool via a first pivot point.

6. The method as recited in claim 5 wherein a force is exerted in the direction of rotation on the top side of the lever, the lever as a result pivoting about the pivot point in the direction of rotation.

7. The method as recited in claim 6 wherein the force is no longer exerted on the top side of the lever element, the lever as a result pivoting back into the starting position about the first pivot point with the aid of a spring.

8. The method as recited in claim 1 wherein the handle further comprises an activator for activating the drive, the activator and the signal transmitter being positioned on a connecting element.

9. The method as recited in claim 8 wherein the activator is an activation switch.

10. The method as recited in claim 8 wherein the activator is moved reversibly from the first position to the second position by exertion of a force.

11. The power tool as recited in claim 8 wherein the connecting element is configured in an elongated form and has a first and second end.

12. The power tool as recited in claim 8 wherein the activator is positioned at the first end and the signal transmitter is positioned at the second end of the connecting element.

13. The power tool as recited in claim 12 further comprising a pivot bearing provided at the first end of the connecting element, such that the connecting element is pivotable about a second pivot point.

14. A handle apparatus on a power tool having a drive, a controller, and a transmission, the handle apparatus comprising:

a lever pivotable relative to a housing of the power tool, the lever element being movable reversibly relative to the housing of the power tool by exertion of a force in one direction; and
a sensor contained for sensing at least one first or second position of the lever relative to the housing of the power tool, the controller configured to determine an acceleration of a signal transmitter from the first position to the second position and to set a first rotational speed for the drive for output of a first impact energy value of the transmission when the determined acceleration reaches a first predetermined threshold value or to set a second rotational speed for the drive for output of a second impact energy value of the transmission when the determined acceleration reaches a second predetermined threshold value.

15. The handle apparatus as recited in claim 14 wherein the lever contains the signal transmitter, the signal transmitter including at least one magnet and the sensor containing at least one first and second Hall sensor for sensing the at least one magnet, wherein the signal transmitter is movable reversibly relative to the sensor device.

16. A chipping hammer comprising the handle apparatus as recited in claim 15.

17. A method for an open-loop and closed-loop control of a power tool, the power tool having a drive, a controller, a sensor, a transmission and a handle, wherein the handle contains a lever with a signal transmitter, the lever being pivotable relative to the sensor, the method comprising steps of:

sensing a first and second position of the signal transmitter by the sensor;
determining an acceleration of the signal transmitter from the first position to the second position by the controller; and
setting a first rotational speed for the drive by the controller for output of a first impact energy value of the transmission when the determined acceleration reaches a first predetermined threshold value or setting a second rotational speed for the drive by the controller for output of a second impact energy value of the transmission when the determined acceleration reaches a second predetermined threshold value;
wherein the handle further comprises an activator for activating the drive, the activator and the signal transmitter being positioned on a connecting element.

18. The method as recited in claim 17 wherein the activator is an activation switch.

19. The method as recited in claim 17 wherein the activator is moved reversibly from the first position to the second position by exertion of a force.

20. The power tool as recited in claim 17 wherein the connecting element is configured in an elongated form and has a first and second end.

* * * * *